(12) United States Patent
Qian et al.

(10) Patent No.: US 12,108,592 B2
(45) Date of Patent: Oct. 1, 2024

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Dahan Qian, Hefei (CN); Jie Zhang, Hefei (CN); Juanjuan Huang, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 450 days.

(21) Appl. No.: 17/668,769

(22) Filed: Feb. 10, 2022

(65) Prior Publication Data
US 2023/0034627 A1 Feb. 2, 2023

Related U.S. Application Data

(63) Continuation of application No. PCT/CN2021/121027, filed on Sep. 27, 2021.

(30) Foreign Application Priority Data

Aug. 2, 2021 (CN) .......................... 202110881714.8

(51) Int. Cl.
*H10B 12/00* (2023.01)

(52) U.S. Cl.
CPC ........... *H10B 12/482* (2023.02); *H10B 12/30* (2023.02)

(58) Field of Classification Search
CPC .... H10B 12/30; H10B 12/482; H10B 12/485; H10B 41/50; H10B 43/50; H10B 51/50; H10B 53/50

See application file for complete search history.

(56) References Cited

U.S. PATENT DOCUMENTS

2020/0035628 A1* 1/2020 Huang .................... H01L 24/05

FOREIGN PATENT DOCUMENTS

| CN | 108987397 A | 12/2018 |
| CN | 112864098 A | 5/2021 |

OTHER PUBLICATIONS

Yimin Wang, Ray Y. Lin. "Amorphous molybdenum nitride thin films prepared by reactive sputter deposition". Materials Science and Engineering: B, 112(2004), 42-49.

(Continued)

*Primary Examiner* — Michelle Mandala
*Assistant Examiner* — Kevin Quinto
(74) *Attorney, Agent, or Firm* — Kilpatrick Townsend & Stockton LLP

(57) ABSTRACT

A semiconductor structure and a method for manufacturing same are provided. The semiconductor structure includes: a doped conductive layer, doped with dopant ions; a metal conductive layer, located above the doped conductive layer; a nitrogen-containing dielectric layer, located above the metal conductive layer; a first molybdenum nitride layer, located between the doped conductive layer and the metal conductive layer and configured to be electrically connected to the doped conductive layer and the metal conductive layer; and a second molybdenum nitride layer, located between the metal conductive layer and the nitrogen-containing dielectric layer, where an atomic ratio of nitrogen atoms in the second molybdenum nitride layer is greater than an atomic ratio of nitrogen atoms in the first molybdenum nitride layer.

16 Claims, 4 Drawing Sheets

(56) References Cited

OTHER PUBLICATIONS

I. Jauberteau etc. "Plasma nitriding of thin molybdenum layers at low temperature". Surface and Coatings Technology, 116-119(1999), 222-228.
Jian-Ying Xiang, Fan-Bean Wu. "Gas inlet and input power modulated sputtering molybdenum nitride thin films". Surface and Coatings Technology, 332(2017), 161-167.
V. P. Anitha, A. BhaRacharya etc. "Study of sputtered molybdenum nitride as a diffusion barrier". Thin Solid Films, 236(1993), 306-310.
N. Haberkorn, S. Bengio etc, "Effect of the nitrogen-argon gas mixtures on the superconductivity properties of reactively sputtered molybdenum nitride thin films", Materials Letters 215 (2018) 15-18.

\* cited by examiner

SEMICONDUCTOR STRUCTURE AND METHOD FOR MANUFACTURING SAME

CROSS-REFERENCE TO RELATED APPLICATIONS

This application is a continuation application of International Application No. PCT/CN2021/121027, filed on Sep. 27, 2021, which claims priority to Chinese Patent Application No. 202110881714.8, filed on Aug. 2, 2021. The disclosures of International Application No. PCT/CN2021/121027 and Chinese Patent Application No. 202110881714.8 are hereby incorporated by reference in their entireties.

BACKGROUND

With the improvement of performance requirements and technological progress, semiconductor structures have been gradually miniaturized, and the thicknesses of film layers inside the semiconductor structures have been constantly decreased. Due to the decrease in thickness of the film layer, the blocking performance of the film layer per se will be weakened under the condition that the material of the film layer remains unchanged, and thus the performance of an original specially-arranged blocking layer may no longer satisfy the requirements or the film layer that has a certain blocking effect and originally has specific electrical characteristics can no longer yield the blocking effect, which makes the characteristics of some functional film layers susceptible to neighboring film layers and then weakens the electrical characteristics of the functional film layers.

SUMMARY

Embodiments of this disclosure relate to a semiconductor structure and a method for manufacturing same.

The embodiments of this disclosure provide a semiconductor structure, including: a doped conductive layer, doped with dopant ions; a metal conductive layer, located above the doped conductive layer; a nitrogen-containing dielectric layer, located above the metal conductive layer; a first molybdenum nitride layer, located between the doped conductive layer and the metal conductive layer and configured to be electrically connected to the doped conductive layer and the metal conductive layer; and a second molybdenum nitride layer, located between the metal conductive layer and the nitrogen-containing dielectric layer, where an atomic ratio of nitrogen atoms in the second molybdenum nitride layer is greater than an atomic ratio of nitrogen atoms in the first molybdenum nitride layer.

The embodiments of this disclosure further provide a method for manufacturing a semiconductor structure, including the following operations. A doped conductive layer is formed, in which the doped conductive layer is doped with dopant ions. A first molybdenum nitride layer is formed, which is on the doped conductive layer. A metal conductive layer is formed, which is on the first molybdenum nitride layer, and is configured to be electrically connected to the doped conductive layer and the metal conductive layer. A second molybdenum nitride layer is formed, which is on the metal conductive layer, and an atomic ratio of nitrogen atoms in the second molybdenum nitride layer is greater than an atomic ratio of nitrogen atoms in the first molybdenum nitride layer. A nitrogen-containing dielectric layer is formed, which on the second molybdenum nitride layer.

BRIEF DESCRIPTION OF THE DRAWINGS

One or more embodiments are exemplified by figures in the corresponding accompany drawings. These exemplary illustrations do not constitute any limitation to the embodiments. The elements with the same reference numerals in the accompany drawings are denoted as similar elements. Unless otherwise stated, the figures in the accompany drawings do not constitute any scale limitation.

DETAILED DESCRIPTION

In manufacturing of a semiconductor structure, since transition metal tungsten is featured by a small specific electrical resistance, stable physical and chemical performance, etc., tungsten can serve as the material of a metal conductive layer. However, tungsten is prone to be lateral etched during an etching process to cause a recess, which may lead to a decreased lateral effective width of the metal conductive layer and an increased resistance of the metal conductive layer. Since silicon nitride has a small dielectric constant and high hardness and thus simultaneously has electrical isolation and support effects, silicon nitride often serves as the material of a protective layer of the metal conductive layer. However, during producing the silicon nitride material using a high-temperature process, nitrogen atoms may react with tungsten to produce a tungsten nitride material, which may decrease the film thickness of the metal conductive layer and then increase the resistance of the metal conductive layer.

In order to make the objectives, technical solutions and advantages of embodiments of this disclosure clearer, various embodiments of this disclosure will be described in detail below in combination with the accompanying drawings. However, it can be understood by persons of ordinary skills in the art that, in various embodiments of this disclosure, many technical details have been proposed in order to give the reader a better understanding of this disclosure. However, the technical solutions claimed in this disclosure can be implemented even without these technical details and various changes and modifications based on the following various embodiments.

Figure 1:
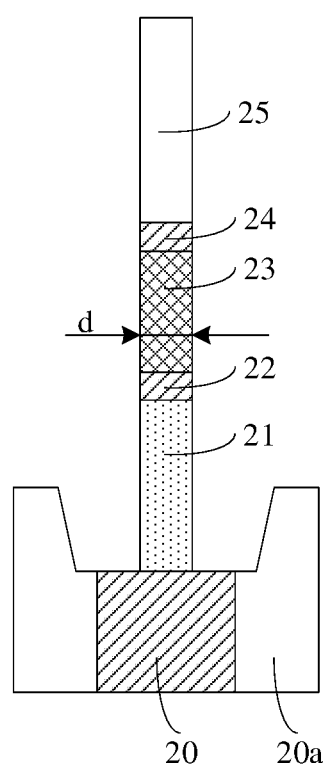
FIG. 1 is a schematic structural diagram of a semiconductor structure provided in embodiments of this disclosure.

Referring to FIG. 1, a semiconductor structure includes: a doped conductive layer 21, doped with dopant ions; a metal conductive layer 23, located above the doped conductive layer 21; a nitrogen-containing dielectric layer 25, located above the metal conductive layer 23; a first molybdenum nitride layer 22, located between the doped conductive layer 21 and the metal conductive layer 23 and configured to be electrically connected to the doped conductive layer 21 and the metal conductive layer 23; and a second molybdenum nitride layer 24, located between the metal conductive layer 23 and the nitrogen-containing dielectric layer 25, in which an atomic ratio of nitrogen atoms in the second molybdenum nitride layer 24 is greater than an atomic ratio of nitrogen atoms in the first molybdenum nitride layer 22.

The dopant ions in the doped conductive layer 21 may be P-type ions or N-type ions; and a main material of the doped conductive layer 21 may be adjusted according to actual requirements, for example, depending on the contact resistance between the doped conductive layer 21 and a neighboring film layer, the cost of manufacturing the doped conductive layer 21, and the conductive performance of the doped conductive layer 21. The main material refers to the material other than the dopant ions in the doped conductive layer 21, and the main material includes an intrinsic semiconductor material such as amorphous silicon, polysilicon or microcrystalline silicon. The text is explained in detail by taking the doped conductive layer 21 being a polysilicon material doped with N-type ions as an example.

The metal conductive layer 23 may be composed of one or more metal materials, and may also be composed of a metal material and a non-metal material. When the metal conductive layer 23 is composed of the metal material and the non-metal material, the metal material yields the main conductive effect. One or more film layers including the first molybdenum nitride layer 22 may be provided between the metal conductive layer 23 and the doped conductive layer 21, so as to adjust a series resistance between the metal conductive layer 23 and the doped conductive layer 21, in which the series resistance includes a contact resistance between neighboring film layers.

The material of the nitrogen-containing dielectric layer 25 may be adjusted according to actual performance requirements. For example, the material having a small dielectric constant is selected to achieve good electrical isolation, the material having low hardness is selected to achieve stress buffer, or the material having high hardness is selected to achieve a good support effect. During practical process preparation, a silicon nitride or silicon oxynitride material having a good support effect and a low lost is generally selected to form the nitrogen-containing dielectric layer 25. Similarly, one or more film layers including the second molybdenum nitride layer 24 may be provided between the metal conductive layer 23 and the nitrogen-containing dielectric layer 25, and the multiple film layers are stacked in sequence in a direct from the doped conductive layer 21 to the nitrogen-containing dielectric layer 25.

It should be noted that an application scene of the semiconductor structure provided in the embodiments of this disclosure is not limited by those in the text, and the material of each film layer and the ratio of components thereof can be adjusted according to the actual application scene. In one embodiment, the semiconductor structure provided in the embodiments of this disclosure serves as a bit line structure, in which the doped conductive layer 21 serves as a bit line to contact and be electrically connected to an active area 20, the metal conductive layer 23 serves as a bit line to transmit electrical signals, and the nitrogen-containing dielectric layer 25 serves as a top insulating layer and mainly yields the effects of electrical isolation and supporting an upper film layer.

In this embodiment, the thickness of the first molybdenum nitride layer 22 is greater than the thickness of the second molybdenum nitride layer 24 in a direction from the doped conductive layer 21 to the nitrogen-containing dielectric layer 25. Compared with the approach of changing composition of the material of the first molybdenum nitride layer 22 to improve the blocking performance of the first molybdenum nitride layer 22, the approach of increasing the thickness improves the blocking performance of the first molybdenum nitride layer 22 and has little influence on the resistance of the first molybdenum nitride layer 22, which is conducive to ensuring that the first molybdenum nitride layer 22 not only has the equivalent blocking performance to that of the second molybdenum nitride layer 24, but also has excellent conductive performance.

It can be understood that since the atomic nucleus of the nitrogen atom is small, the repulsive force between neighboring nitrogen atoms is weak and the distance between neighboring nitrogen atoms is short. Based on this fact, the greater the atomic ratio of nitrogen atoms in the first molybdenum nitride layer 22, the shorter the distance between neighboring atoms in the first molybdenum nitride layer 22, and the less likely it is for a carrier to pass through the first molybdenum nitride layer 22 and to pass through a contact interface between the first molybdenum nitride layer 22 and a neighboring film layer. That is to say, as the atomic ratio of nitrogen atoms increases, the blocking performance of the molybdenum nitride layer is improved, and the resistance of the molybdenum nitride layer per se and the contact resistance with the neighboring film layer increase. Compared with increasing the atomic ratio of nitrogen atoms in the first molybdenum nitride layer 22, increasing the film thickness of the first molybdenum nitride layer 22 will merely change the resistance of the first molybdenum nitride layer 22 per se, but will not change the contact resistance between the first molybdenum nitride layer 22 and the neighboring film layer, which is conducive to adjusting the blocking performance and the conductive performance of the first molybdenum nitride layer 22 more precisely, so that the first molybdenum nitride layer 22 has relatively balanced comprehensive performance.

In addition, since the nitrogen-containing dielectric layer 25 is a dielectric layer and there is no signal transmission between the nitrogen-containing dielectric layer 25 and the metal conductive layer 23. When setting the atomic ratio of nitrogen atoms in the second molybdenum nitride layer 24, it is unnecessary to consider the factor of resistance, and it is only required to suppress diffusion of the nitrogen atoms in the nitrogen-containing dielectric layer 25. In other words, the nitrogen atoms can be blocked by increasing the atomic ratio of nitrogen atoms in the second molybdenum nitride layer 24, and in the case that the blocking performance of the second molybdenum nitride layer 24 can satisfy the requirements, the thickness of the second molybdenum nitride layer 24 can be decreased, so as to thin the entire semiconductor structure.

In this embodiment, the atomic ratio of nitrogen atoms in the first molybdenum nitride layer 22 is 10% to 20%, for example, 13%, 15% or 17%, and the thickness of the first molybdenum nitride layer 22 is 2 nm to 4 nm, for example, 2.5 nm, 3 nm or 3.5 nm, in the direction from the doped conductive layer 21 to the nitrogen-containing dielectric layer 25. When the atomic ratio of nitrogen atoms or the thickness of the first molybdenum nitride layer 22 is too large, it is likely to cause a large resistance of the first molybdenum nitride layer 22 and then cause weakened signal transmission performance of the first molybdenum nitride layer 22. Whereas when the atomic ratio of nitrogen atoms or the thickness of the first molybdenum nitride layer 22 is too small, it is likely to cause weak blocking performance of the first molybdenum nitride layer 22, which is not conducive to suppressing mutual diffusion between the metal ions of the metal conductive layer 23 and the dopant ions of the doped conductive layer 21. The mutual diffusion between the metal ions and the dopant ions may cause degraded conductive performance of the metal conductive layer 23 and the doped conductive layer 21, thereby influencing the signal transmission performance of the metal conductive layer 23 and the doped conductive layer 21.

In this embodiment, the atomic ratio of nitrogen atoms in the second molybdenum nitride layer 24 is 30% to 40%, for example, 33%, 35% or 37%. When the atomic ratio of nitrogen atoms is small, it is not conducive to blocking diffusion of nitrogen atoms in the nitrogen-containing dielectric layer 25 to the metal conductive layer 23; and when the atomic ratio of nitrogen atoms is too large, it is likely to cause the second molybdenum nitride layer 24 to become a contamination source of nitrogen atoms, that is, the nitrogen atoms in the second molybdenum nitride layer 24 diffuse into the metal conductive layer 23.

It can be understood that when the atomic ratio of nitrogen atoms in the second molybdenum nitride layer 24 is set to be large, the second molybdenum nitride layer 24 can block the nitrogen atoms in the nitrogen-containing dielectric layer 25 through two mechanisms, which are specifically explained as follows. First, when the atomic ratio of nitrogen atoms is large, the distance between neighboring atoms is small and it is not easy for the nitrogen atoms to pass through. Second, when the atomic ratio of nitrogen atoms is large, the doping concentration of the nitrogen atoms is high (a nitride can be understood as doping nitrogen atoms in another kind of atoms), the doping concentration of the nitrogen atoms in the second molybdenum nitride layer 24 is higher than or equal to the doping concentration of the nitrogen atoms in the nitrogen-containing dielectric layer 25, or, the difference between the doping concentration of the nitrogen atoms in the second molybdenum nitride layer 24 and the doping concentration of the nitrogen atoms in the nitrogen-containing dielectric layer 25 is small, which is conducive to avoiding the nitrogen atoms in the nitrogen-containing dielectric layer 25 from diffusing into the metal conductive layer 23 based on the concentration difference.

In this embodiment, as the atomic ratio of nitrogen atoms in the second molybdenum nitride layer 24 changes, the thickness of the second molybdenum nitride layer 24 changes, so as to ensure that the blocking performance of the second molybdenum nitride layer 24 is higher than a preset level. Exemplarily, the thickness of the second molybdenum nitride layer 24 is 0.5 nm to 1.5 nm, for example, 0.8 nm, 1 nm or 1.2 nm, in the direction from the doped conductive layer 21 to the nitrogen-containing dielectric layer 25. When the thickness of the second molybdenum nitride layer 24 is too large, it is not conducive to thinning the entire semiconductor structure, and may cause the second molybdenum nitride layer 24 to become a nitrogen atom source, i.e., the nitrogen atoms included in the second molybdenum nitride layer 24 diffuse into the metal conductive layer 23; and when the thickness of the second molybdenum nitride layer 24 is too small, it is not conducive to blocking the nitrogen atoms in the nitrogen-containing dielectric layer 25 from diffusing into the metal conductive layer 23.

In this embodiment, the material of the metal conductive layer 23 includes metal molybdenum. Compared with metal tungsten, metal molybdenum is less prone to lateral etching during an etching process, which is conducive to ensuring that each discrete metal conductive layer 23 formed by patterned etching has a preset lateral effective width d, so that the metal conductive layer 23 has a small resistance.

In this embodiment, the metal conductive layer 23 is composed of a single metal material. In this case, the first molybdenum nitride layer 22, the metal conductive layer 23, and the second molybdenum nitride layer 24 can be continuously formed in a same reaction chamber, without interrupting the manufacturing process to adjust the metal source, which is conducive to avoiding a vacuum environment from being destroyed to cause the surface of the film layer to be oxidized and is conducive to ensuring the continuity between different film layers. It can be understood that if the metal conductive layer 23 further includes other metal materials, it is required to perform a cleaning process or change the chamber after forming the metal conductive layer 23, so as to avoid the other metal materials left in the reaction chamber from contaminating the second molybdenum nitride layer 24.

In this embodiment, the first molybdenum nitride layer 22 and the second molybdenum nitride layer 24 each include a molybdenum nitride material having a polycrystalline structure. Exemplarily, the molybdenum nitride material having a polycrystalline structure includes polycrystalline γ-Mo$_2$N. Furthermore, the crystallinity of the molybdenum nitride material in the first molybdenum nitride layer 22 is greater than the crystallinity of the molybdenum nitride material in the second molybdenum nitride layer 24. It should be noted that the larger the atomic ratio of nitrogen atoms, the more difficult it is to crystallize a molybdenum nitride material having an amorphous structure. Before crystallization, if the first molybdenum nitride layer 22 and the second molybdenum nitride layer 24 each include a molybdenum nitride material having an amorphous structure, under a same crystallization condition, the crystallinity of the molybdenum nitride material in the first molybdenum nitride layer 22 is greater than the crystallinity of the molybdenum nitride material in the second molybdenum nitride layer 24. The higher the crystallinity, the larger the crystal particles, the fewer the crystal boundaries, the more regular the arrangement of the crystal particles, the smaller the sheet resistance of the molybdenum nitride material. The greater crystallinity of the molybdenum nitride material in the first molybdenum nitride layer 22 is conducive to ensuring that the first molybdenum nitride layer 22 has higher signal transmission performance.

In this embodiment, by controlling the atomic ratio of nitrogen atoms in the first molybdenum nitride layer to be smaller the sheet resistance of the material of the first molybdenum nitride layer is decreased, which is conducive to a small series resistance between the doped conductive layer and the metal conductive layer, and ensuring that the first molybdenum nitride layer not only can block mutual migration and penetration between the metal atoms and the dopant ions, but also has little influence on electrical connection performance between the metal conductive layer and the doped conductive layer. Meanwhile, the atomic ratio of nitrogen atoms in the second molybdenum nitride layer is controlled to be larger, which is conducive to enabling strong blocking performance of the second molybdenum nitride layer, better blocking migration of nitrogen atoms in the nitrogen-containing dielectric layer to the metal conductive layer, and ensuring that the metal conductive layer has better conductive characteristics.

Correspondingly, embodiments of this disclosure further provide a method for manufacturing a semiconductor structure, which can be configured to manufacture the foregoing semiconductor structure.

FIG. 1 to FIG. 4 are schematic structural diagrams corresponding to various operations of a method for manufacturing a semiconductor structure provided in embodiments of this disclosure. The method for manufacturing a semiconductor structure includes the following operations.

Figure 2:
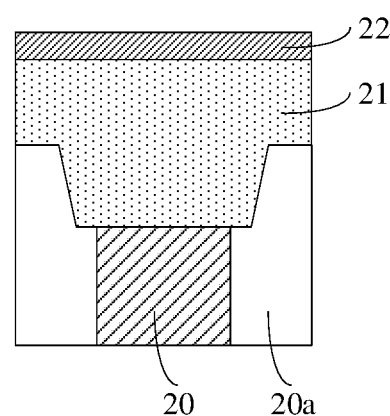
FIG. 2 to FIG. 4 are schematic structural diagrams corresponding to various operations of a method for manufacturing a semiconductor structure provided in embodiments of this disclosure.

Referring to FIG. 2, a doped conductive layer 21 and a first molybdenum nitride layer 22 are formed, where the doped conductive layer 21 is doped with dopant ions, and the first molybdenum nitride layer 22 is located on the doped conductive layer 21.

In this embodiment, the doped conductive layer 21 is connected to an active area 20 at the bottom, and an isolation structure 20a surrounds the active area 20 and is configured to isolate neighboring active areas 20. The process of forming the first molybdenum nitride layer 22 includes the following. A nitrogen source gas and metal molybdenum are introduced. An ionization process is performed to form nitrogen plasma, so that the nitrogen plasma reacts with the metal molybdenum to produce molybdenum nitride, and the molybdenum nitride is deposited to form a molybdenum nitride layer, which has an amorphous structure. The metal molybdenum may be fed using an inert gas, the nitrogen source gas includes nitrogen, and the inert gas includes argon.

Figure 3:
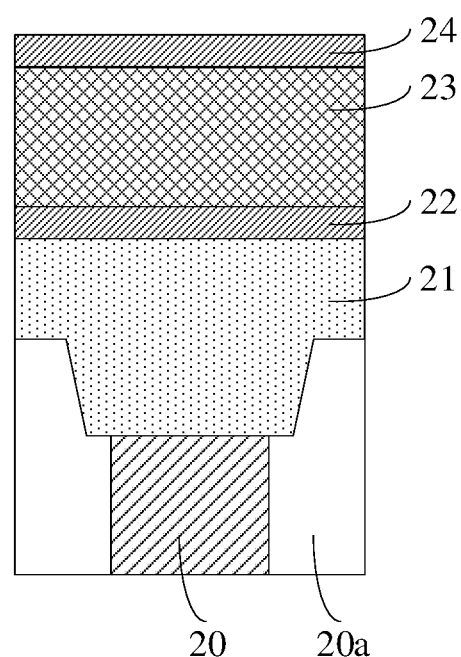

Referring to FIG. 3, a metal conductive layer 23 and a second molybdenum nitride layer 24 are formed, where the metal conductive layer 23 is located on the first molybdenum nitride layer 22, the first molybdenum nitride layer 22 is configured to be electrically connected to the doped conductive layer 21 and the metal conductive layer 23, the second molybdenum nitride layer 24 is located on the metal conductive layer 23, and an atomic ratio of nitrogen atoms in the second molybdenum nitride layer 24 is greater than an atomic ratio of nitrogen atoms in the first molybdenum nitride layer 22.

In this embodiment, the atomic ratio of nitrogen atoms in the second molybdenum nitride layer 24 is greater than the atomic ratio of nitrogen atoms in the first molybdenum nitride layer 22, the blocking performance of the material of the second molybdenum nitride layer 24 is higher than the blocking performance of the material of the first molybdenum nitride layer 22. In order to enable the first molybdenum nitride layer 22 to have a strong blocking effect, it is required to configure that the thickness of the first molybdenum nitride layer 22 is greater than the thickness of the second molybdenum nitride layer 24 in a direction from the doped conductive layer 21 to the second molybdenum nitride layer 24.

In this embodiment, the process step of forming the first molybdenum nitride layer 22 and the process step of forming the second molybdenum nitride layer 24 are identical, and are merely different from each other in that the flow rate of the nitrogen source gas for forming the first molybdenum nitride layer 22 is smaller than the flow rate of the nitrogen source gas for forming the second molybdenum nitride layer 24, such that the atomic ratio of nitrogen atoms in the second molybdenum nitride layer 24 is greater than the atomic ratio of nitrogen atoms in the first molybdenum nitride layer 22.

Further, in the processes of forming the first molybdenum nitride layer 22 and the second molybdenum nitride layer 24, the ratios of the flow rates of the nitrogen source gases to the sums of the flow rates of the nitrogen source gases and the inert gases are identical, and the process temperatures are identical, which are conducive to enabling the performance, other than the atomic ratio, of the first molybdenum nitride layer 22 and the second molybdenum nitride layer 24 to be similar. Exemplarily, during the process of forming the first molybdenum nitride layer 22, the flow rate of the nitrogen source gas is 35 sccm, the flow rate of the inert gas is 15 sccm, the ratio of the flow rates is 70%, and the process temperature is 250° C.; and in the process of forming the second molybdenum nitride layer 24, the flow rate of the nitrogen source gas is 70 sccm, the flow rate of the inert gas is 35 sccm, the ratio of the flow rates maintains 70%, and the process temperature maintains 250° C.

In this embodiment, the ionization process of forming the first molybdenum nitride layer 22 is denoted as a first ionization process, and the ionization process of forming the second molybdenum nitride layer 24 is denoted as a second ionization process. Since the thickness of the first molybdenum nitride layer 22 is greater than the thickness of the second molybdenum nitride layer 24 in the case that blocking performances are similar, specific parameters of the first ionization process and specific parameters of the second ionization process are different. Specifically, since the higher the direct-current power supply power, the greater the speed of reaction between the nitrogen plasma and the metal molybdenum, and the greater the deposition speed of the molybdenum nitride layer, it is available to configure that the direct-current power supply power of the first ionization process is higher than or equal to the direct-current power supply power of the second ionization process, such that the time spent to manufacture the first molybdenum nitride layer 22 is shorter. Correspondingly, since the higher the radio frequency bias power, the better the film layer uniformity, and the requirement for the film layer uniformity of a thick film layer is lower, it is available to configure that the radio frequency bias power of the first ionization process is lower than or equal to the radio frequency bias power of the second ionization process, such that the second molybdenum nitride layer 24 has higher film layer uniformity, i.e., the second molybdenum nitride layer 24 has good blocking performance.

It is available to configure that the direct-current power supply power of the first ionization process is 2000 W to 3000 W, for example, 2300 W, 2500 W or 2700 W, and the direct-current power supply power of the second ionization process is 1500 W to 2500 W, for example, 1700 W, 2000 W or 2300 W. When the direct-current power supply power is high, it is likely to cause a fast deposition speed of the molybdenum nitride layer, and thus it is not easy to precisely control the thicknesses of the first molybdenum nitride layer 22 and the second molybdenum nitride layer 24; and when the direct-current power supply power is low, it is likely to cause a slow deposition speed of the molybdenum nitride layer, which is not conducive to shortening the overall manufacturing duration. Correspondingly, it is available to configure that the radio frequency bias power of the first ionization process is 500 W to 750 W, for example, 550 W, 600 W, 650 W or 700 W, and to configure that the radio frequency bias power of the second ionization process is 600 W to 800 W, for example, 650 W, 700 W or 750 W. When the radio frequency bias power is high, it is not conducive to reducing the process power consumption and the process cost; and when the radio frequency bias power is low, it is not conducive to improving the uniformity and compactness of the molybdenum nitride layer.

Figure 4:
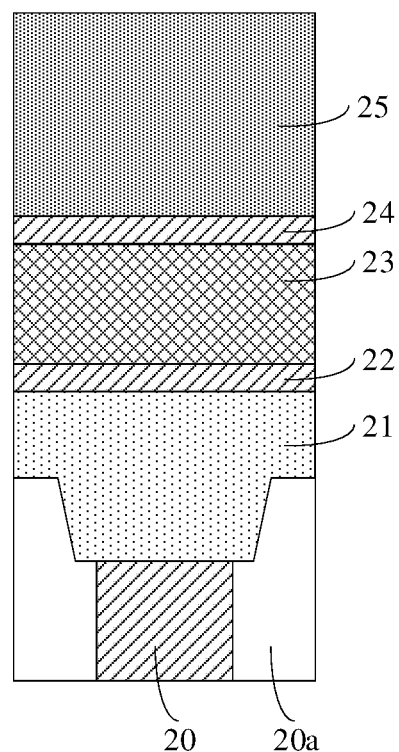

Referring to FIG. 4 and FIG. 1, a nitrogen-containing dielectric layer 25 is formed, and is located on the second molybdenum nitride layer 24, and a patterned etching process is performed to form multiple discrete semiconductor structures, where the semiconductor structure may be a bit line structure.

In this embodiment, since the nitrogen-containing dielectric layer 25 is grown in a thermal treatment process environment, under the effect of the high-temperature process, at least parts of the amorphous structures in the molybdenum nitride layers (i.e., the first molybdenum nitride layer 22 and the second molybdenum nitride layer 24) will be converted into the polycrystalline structures. Meanwhile, since the atomic ratio of nitrogen atoms in the second molybdenum nitride layer 24 is larger, the crystallinity of the molybdenum nitride material in the second molybdenum nitride layer 24 is lower. In other embodiments, after the second molybdenum nitride layer is formed, the thermal treatment process is performed, so that at least part of the amorphous structure in the molybdenum nitride layer is converted into the polycrystalline structure, or, after the nitrogen-containing dielectric layer 25 is formed, at least part of the amorphous structure is converted into the polycrystalline structure using other thermal treatment processes.

In this embodiment, the metal conductive layer 23 is a metal molybdenum layer, and the first molybdenum nitride layer 22, the second molybdenum nitride layer 24, and the metal molybdenum layer are formed in a same reaction chamber.

In the foregoing technical solution, the atomic ratio of nitrogen atoms in the first molybdenum nitride layer is controlled to be smaller, thereby decreasing the sheet resistance of the material of the first molybdenum nitride layer, enabling a small series resistance between the doped conductive layer and the metal conductive layer, and ensuring that the first molybdenum nitride layer not only can block mutual migration and penetration between metal atoms and the dopant ions, but also has little influence on electrical connection performance between the metal conductive layer and the doped conductive layer. Meanwhile, the atomic ratio of nitrogen atoms in the second molybdenum nitride layer is controlled to be larger, which is conducive to enabling strong blocking performance of the second molybdenum nitride layer, better blocking migration of nitrogen atoms in the nitrogen-containing dielectric layer to the metal conductive layer, and ensuring that the metal conductive layer has a better conductive characteristic.

It can understand by persons of ordinary skill in the art that the above-mentioned implementations are specific embodiments for implementing this disclosure, and in practical applications, various changes may be made in form and detail without departing from the spirit and scope of this disclosure. Any person skilled in the art can make changes and modifications without departing from the spirit and scope of this disclosure. Therefore, the scope of protection of this disclosure shall be subject to the scope defined in the claims.

The invention claimed is:

1. A semiconductor structure, comprising:
a doped conductive layer, doped with dopant ions;
a metal conductive layer, located above the doped conductive layer;
a nitrogen-containing dielectric layer, located above the metal conductive layer;
a first molybdenum nitride layer, located between the doped conductive layer and the metal conductive layer and configured to be electrically connected to the doped conductive layer and the metal conductive layer; and
a second molybdenum nitride layer, located between the metal conductive layer and the nitrogen-containing dielectric layer, wherein an atomic ratio of nitrogen atoms in the second molybdenum nitride layer is greater than an atomic ratio of nitrogen atoms in the first molybdenum nitride layer.

2. The semiconductor structure of claim 1, wherein a thickness of the first molybdenum nitride layer is greater than a thickness of the second molybdenum nitride layer in a direction from the doped conductive layer to the nitrogen-containing dielectric layer.

3. The semiconductor structure of claim 1, wherein the atomic ratio of nitrogen atoms in the first molybdenum nitride layer is 10% to 20%, and a thickness of the first molybdenum nitride layer is 2 nm to 4 nm in a direction from the doped conductive layer to the nitrogen-containing dielectric layer.

4. The semiconductor structure of claim 1, wherein the atomic ratio of nitrogen atoms in the second molybdenum nitride layer is 30% to 40%.

5. The semiconductor structure of claim 4, wherein a thickness of the second molybdenum nitride layer is 0.5 nm to 1.5 nm in a direction from the doped conductive layer to the nitrogen-containing dielectric layer.

6. The semiconductor structure of claim 1, wherein a material of the metal conductive layer comprises metal molybdenum.

7. The semiconductor structure of claim 1, wherein the first molybdenum nitride layer and the second molybdenum nitride layer each comprise a molybdenum nitride material having a polycrystalline structure.

8. The semiconductor structure of claim 7, wherein crystallinity of the molybdenum nitride material in the first molybdenum nitride layer is greater than crystallinity of the molybdenum nitride material in the second molybdenum nitride layer.

9. The semiconductor structure of claim 7, wherein the molybdenum nitride material having a polycrystalline structure comprises polycrystalline γ-$Mo_2N$.

10. The semiconductor structure of claim 1, wherein the doped conductive layer is electrically connected to an active area, a material of the doped conductive layer comprises doped polysilicon, and the dopant ions comprise N-type ions.

11. A method for manufacturing a semiconductor structure, comprising:
forming a doped conductive layer, wherein the doped conductive layer is doped with dopant ions;
forming a first molybdenum nitride layer, wherein the first molybdenum nitride layer is located on the doped conductive layer;
forming a metal conductive layer, wherein the metal conductive layer is located on the first molybdenum nitride layer, and the first molybdenum nitride layer is configured to be electrically connected to the doped conductive layer and the metal conductive layer;
forming a second molybdenum nitride layer, wherein the second molybdenum nitride layer is located on the metal conductive layer, and an atomic ratio of nitrogen atoms in the second molybdenum nitride layer is greater than an atomic ratio of nitrogen atoms in the first molybdenum nitride layer; and
forming a nitrogen-containing dielectric layer, wherein the nitrogen-containing dielectric layer is located on the second molybdenum nitride layer.

12. The method for manufacturing a semiconductor structure of claim 11, wherein forming the first molybdenum nitride layer and forming the second molybdenum nitride layer respectively comprise:
introducing a nitrogen source gas and metal molybdenum, wherein a flow rate of the nitrogen source gas for forming the first molybdenum nitride layer is smaller than a flow rate of the nitrogen source gas for forming the second molybdenum nitride layer; and
performing an ionization process to form nitrogen plasma, so that the nitrogen plasma reacts with the metal molybdenum to produce molybdenum nitride, and the molybdenum nitride is deposited to form a molybdenum nitride layer, wherein the molybdenum nitride layer has an amorphous structure.

13. The method for manufacturing a semiconductor structure of claim 12, wherein the ionization process of forming the first molybdenum nitride layer is a first ionization process, the ionization process of forming the second molybdenum nitride layer is a second ionization process, a direct-current power supply power of the first ionization process is higher than or equal to a direct-current power supply power of the second ionization process, and a radio frequency bias power of the first ionization process is lower than or equal to a radio frequency bias power of the second ionization process.

14. The method for manufacturing a semiconductor structure of claim 13, wherein the direct-current power supply power of the first ionization process is 2000 W to 3000 W and the radio frequency bias power thereof is 500 W to 750 W, and the direct-current power supply power of the second ionization process is 1500 W to 2500 W and the radio frequency bias power thereof is 600 W to 800 W.

15. The method for manufacturing a semiconductor structure of claim 11, further comprising: performing a thermal treatment process, to convert at least part of an amorphous structure in each of the first and the second molybdenum nitride layers into a polycrystalline structure.

16. The method for manufacturing a semiconductor structure of claim 11, wherein the metal conductive layer is a metal molybdenum layer, and the first molybdenum nitride layer, the second molybdenum nitride layer, and the metal molybdenum layer are formed in a same reaction chamber.

* * * * *